April 18, 1967 S. G. SHEPHERD, JR 3,315,175

COMPENSATED DEGENERATIVE GAIN CONTROL FOR TRANSISTOR AMPLIFIERS

Filed July 24, 1964

INVENTOR.
Samuel G. Shepherd, Jr.
BY
H. H. Losche
Att'ys.

United States Patent Office 3,315,175
Patented Apr. 18, 1967

3,315,175
COMPENSATED DEGENERATIVE GAIN CONTROL FOR TRANSISTOR AMPLIFIERS

Samuel G. Shepherd, Jr., Severna Park, Md., assignor, by mesne assignments, to the United States of America as represented by the Secretary of the Navy Filed July 24, 1964, Ser. No. 385,096
7 Claims. (Cl. 330—29)

This invention relates to gain control circuits of amplifiers and more particularly to a degenerative gain control circuit for transistor amplifiers with a compensating circuit to maintain correct tuning of the amplifier for all degenerative gain changes.

Gain control is often necessary in the design of amplifiers and more particularly in the design of intermediate frequency amplifiers. Vacuum tube amplifiers can be gain controlled directly because of the trivial detuning effect and the reasonable linear change in gain with change in control voltage. These conditions do not exist in transistor amplifiers. "Forward" or "reverse" gain control of transistor amplifiers result in large detuning effects as well as a large nonlinear change in gain with change in control voltage.

In the present invention the disadvantage of detuning transistor amplifiers whenever gain control is applied to the circuit is substantially eliminated in the use of a common emitter transistor amplifier with a variable emitter degeneration gain control circuit and a base compensation circuit to give the desired characteristics to the control of the gain of the amplifier without detuning the amplified alternating current signals therethrough. By using emitter degeneration the slope and linearity of the change in gain of the transistor amplifier vs. control voltage may be varied to give the desired characteristics. By using a voltage controlled attenuator in the base circuit of the transistor amplifier the change in transistor parameters may be almost completely compensated. In this invention a crystal rectifier is capacitor coupled to the emitter of the transistor amplifier and a control voltage applied to the crystal rectifier to control bypass of the emitter degenerative circuit. A crystal rectifier is also capacitor coupled to the base of the transistor amplifier and controlled by the same control voltage for the first-mentioned crystal rectifier, the crystal rectifiers being oriented in an inverse attenuation relation to cause the detuning effects from emitter degenerative control to be compensated by the base crystal rectifier attenuator. It is therefore a general object of this invention to provide a common emitter degenerative gain control and a base coupled attenuator to compensate for the detuning effects of the emitter degenerative gain control changes by the base attenuator.

These and other objects and the attendance advantages, features and uses will become more apparent to those of ordinary skill in the art as the description proceeds when considered along with the accompanying drawing in which.

Figure 1:
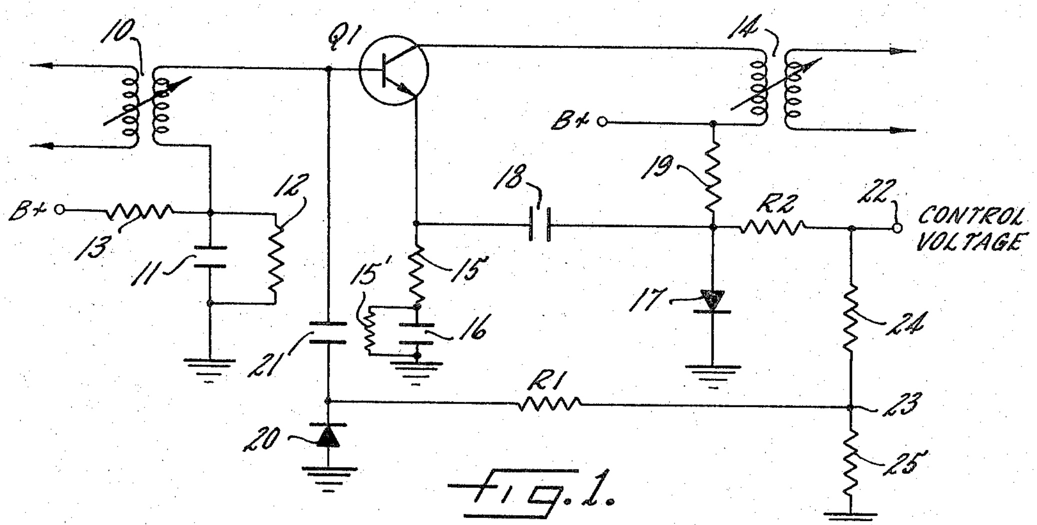
FIGURE 1 illustrates an intermediate frequency transistor amplifier with a common emitter degenerative control circuit and a base compensating circuit coupled thereto.

Referring more particularly to FIGURE 1 wherein a transistor intermediate frequency amplifier is represented, although the invention is applicable to any electron emission type amplifier, a transistor Q1 is shown having its base coupled to the secondary of an input intermediate frequency transformer 10, one lead of which is coupled through a bypass capacitor 11 and a biasing resistor 12 in parallel to a fixed potential, such as ground. This lead of the secondary of transformer 10 is biased from a B+ voltage source through a resistor 13, as shown. The collector is coupled through the primary winding of an output intermediate frequency transformer 14 to a B+ voltage source providing collector voltage. The emitter of transistor Q1 is coupled through a high emitter resistance 15 and a resistor 15′ and bypass capacitor 16 to provide an emitter bias and an impedance network for degenerating transistor Q1. This provides the basic intermediate frequency transistor amplifier circuit.

The degenerative gain control and compensating circuit of this invention comprise the coupling of a crystal rectifier 17 to the emitter of transistor Q1 through a coupling capacitor 18, the cathode of the crystal rectifier 17 being coupled directly to the fixed or ground potential. The anode of the crystal rectifier 17 is biased from a B+ voltage source through a biasing resistor 19. A crystal rectifier 20 has its anode coupled directly to a fixed or ground potential and its cathode coupled through a capacitor 21 to the base electrode of transistor Q1. The cathode of crystal rectifier 20 and the anode of crystal rectifier 17 are each coupled respectively through resistors R1 and R2 to a source of control voltage at 22, with resistors R1 and R2 preferably being equal. The resistor R2 directly couples the anode of crystal rectifier 17 and the control voltage 22, while the resistor R1 couples the cathode of crystal rectifier 20 to a point 23 in a voltage divider consisting of resistors 24 and 25 coupled between the control voltage source 22 and the fixed potential or ground. The voltage divider 24, 25 provides a smaller voltage range to the voltage controlled attenuator 20 in order to provide the proper compensation. The resistors R1 and R2 may have their values changed to control the slope and linearity of the change in gain vs. change in control voltage although it is preferable that these two resistors R1 and R2 be kept at equal value. The changing of the value of resistors R1 and R2 providing changes in slope and linearity will be more fully described in the description of FIGURE 3 hereinbelow.

Figure 2:
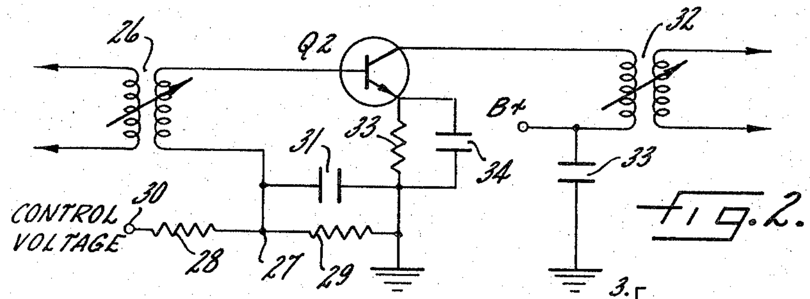
FIG. 2. PRIOR ART
FIGURE 2 illustrates a known intermediate frequency transistor amplifier which is for "reverse" gain control.
Figure 3:
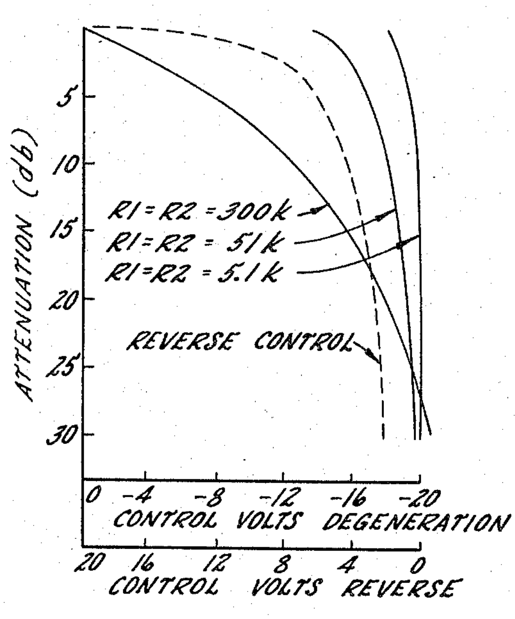
FIGURE 3 is a graphical representation of the transistor amplifier attenuation plotted with respect to frequency voltage degeneration shown in bold lines and with "reverse" control voltage represented in a broken line.
Figure 4:
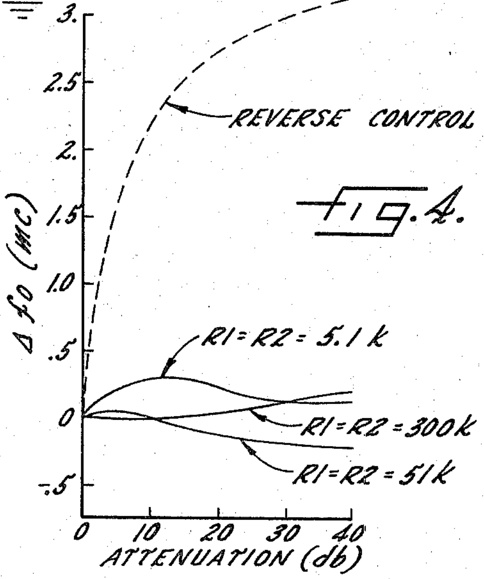
FIGURE 4 is a graphical representation of the transistor amplifier atenuation plotted with respect to frequency and with "reverse" control shown in a broken line.

Referring more particularly to FIGURE 2, a conventional transistor intermediate frequency amplifier is shown to illustrate one means of developing "reverse" control for FIGURES 3 and 4. This amplifier includes a transistor Q2 having its base coupled through the secondary of an input intermediate frequency transformer 26 to a point 27 in a voltage divider circuit consisting of resistors 28 and 29 coupled between a voltage control input 30 and a fixed potential or ground. The resistor 29 is in parallel with a bypass capacitor 31, as shown. The collector of transistor Q2 is coupled through the primary of an output intermediate frequency transformer 32 to a B+ collector voltage source. The B+ collector voltage source is coupled to one plate of a capacitor 33 the opposite plate of which is coupled to ground. The emitter of transistor Q2 is coupled to ground through a parallel circuit consisting of a resistor 33 and a bypass capacitor 34.

*Operation*

In the description of operation occasional reference will be made to FIGURES 3 and 4. With reference to FIGURE 1 where alternating current intermediate frequency signals are being ampliefied by virtue of being applied to the input transformer 10 for amplification on the output transformer 14, the gain control will be in accordance with the control voltage applied to terminal 22 as shown in FIGURE 3 along the line identified as Control Volts Degeneration. Under one condition of operation, where the resistors R1 and R2 are of value of 300*K ohms* (where $K=1000$), the bold line so identified in FIGURE 3 shows the attenuation of the amplifier in decibels (db) as the voltage progresses from 0 to —20. With the control voltage at 0 the bias on the anode of the silicon rectifier 17 through the resistor 19 from the B+ source will cause considerable bypass of the amplified signal from the emitter around the impedance network 15 and 16 providing high gain and substantially zero attenuation. As the control voltage at terminal 22 increases negatively, bypassing of the alternating current in the emitter circuit will be decreased through 17, 18 thus driving more of this emitter current through the impedance circuit 15 and 16 to reduce the gain of the amplifier and to increase the attenuation thereof. As the control voltage changes, the change in the tuning effects produced by the capacitor 18 and the crystal rectifier 17 will tend to change the tuning of the amplifier circuit. This is compensated by virtue of the inverse relation of the crystal rectifiers 17 and 20 to produce a re-tuning on the base electrode for any detuning on the emitter as a result of changes in control voltage at 22. A decrease in attenuation through the crystal rectifier 20 and the coupling capacitor 21 will cause sufficient change in tuning to compensate for detuning resulting in the degenerative network 17 and 18 produced by an increase in attenuation. Accordingly, the transistor amplifier will remain properly tuned for substantially all control voltage applied to control the degenerative gain of the amplifier from an automatic gain control circuit. As may be viewed in FIGURE 3, by changing the resistors R1 and R2 each to a 51K ohm resistor would change the slope and linearity of the attenuation curve. Further reduction of the value of the resistors R1 and R2 to 5.1K ohms would straighten the attenuation curve still more and produce still greater slope.

Referring more particularly to FIGURE 2 with reference to FIGURE 3, the Control Voltage "Reverse" of FIGURE 3 is applied to the terminal 30 of FIGURE 2 to produce the "reverse" control curve as shown in a dashed line in FIGURE 3. Here a control voltage, such as 20 volts at terminal 30, would produce high gain of transistor amplifier Q2 and substantially no attenuation. As the "reverse" voltage approaches zero, attenuation would approach 30 to 40 db. Thus it can be seen in FIGURE 3 the improvement and control provided for in FIGURE 1 over that of "reverse" gain control, as illustrated in FIGURE 2.

FIGURE 4 illustrates the manner in which detuning would occur with "reverse" gain control applied as shown by FIGURE 2, this being illustrated in FIGURE 4 by the dashed line. The bold lines in FIGURE 4 illustrate the greatly reduced effects of detuning as attenuation in db increases. For example, the line identified $R1=R2=300K$ deviates very slightly from a tuned condition while the line identified $R1=R2=51K$ detunes negatively and $R1=R2=5.1$K detunes positively. It is shown that in this manner R1 and R2 can be changed in value to change the linearity and slope of the attenuation line as shown in FIGURE 3 and to maintain a nearly compensated tuned amplifier circuit as shown in FIGURE 4.

While many modifications and changes may be made in the constructional details and features of this invention to more particularly adapt it for particular applications, it is to be understood that I desire to be limited in the spirit of my invention only by the scope of the appended claims.

1. A compensated, degenerative gain control for amplifiers comprising:
   an amplifier including an electron emission device having a control electrode and two conduction electrodes;
   an input for a signal to be amplified coupled to said control electrode and an amplified signal output taken from one of said two conduction electrodes;
   a control voltage input; and
   a first unidirectional variable attenuator capacitor coupled to the other of said two conduction electrodes and a second unidirectional variable attenuator capacitor coupled to said control electrode, said attenuators being coupled to and under the control of said control voltage input to attenuate in inverse relation whereby the control of degeneration of said amplifier likewise controls the compensation of the detuning effects on the amplifier for changes in gain.

2. A compensated, degenerative gain control for amplifiers as set forth in claim 2 wherein
   said attenuators are each a crystal rectifier, each having an anode and a cathode, the anode of said first attenuator and the cathode of said second attenuator being in said capacitor couplings to said other of said two conduction electrodes and to said control electrode, respectively, and the cathode of the first attenuator and the anode of the second attenuator being coupled to a fixed potential.

3. A compensated, degenerative gain control for amplifiers as set forth in claim 3 wherein
   said control voltage input controlling said first and second attenuator crystal rectifiers is coupled to each crystal rectifier through a resistor of equal value.

4. A compensated, degenerative gain control for amplifiers as set forth in claim 4 wherein
   said electron emission device is a transistor in which said control electrode is the base electrode, said one of said two conduction electrodes is the collector electrode, and said other of said two conduction electrodes is the emitter electrode.

5. A compensated, degenerative gain control for transistor amplifiers comprising:
   a transistor amplifier in a biasing network to amplify signals applied to the base electrode on the collector electrode;
   an input of control voltage;
   a first crystal rectifier having an anode coupled through a capacitor to said emitter electrode and a cathode coupled to a fixed potential;
   a second crystal rectifier having a cathode coupled through a capacitor to said base electrode and an anode coupled to said fixed potential;
   a voltage divider coupled between said control voltage input and said fixed potential; and
   a first resistor coupling the anode of said first crystal rectifier and said control voltage input and a second resistor coupling the cathode of said second crystal rectifier and said voltage divider, said first and second resistors being equal whereby changes in control voltage will cause changes in the degenerative gain by said first crystal rectifier of signals amplified effecting changes in tuning that are compensated by said second crystal rectifier.

6. A compensated, degenerative gain control for transistor amplifiers comprising:
   a transistor amplifier in a biasing network having a base electrode transformer coupled to an input of signals to be amplified, having a collector electrode transformer coupled to an output of amplified signals, and having an emitter electrode coupled to a fixed potential through an impedance network;
   an input of control voltage coupled across a voltage divider to said fixed potential;
   a first crystal rectifier having an anode capacitor coupled to said emitter electrode and resistance coupled to said control voltage input and having a cathode coupled to said fixed potential to vary the bypass of signals around said impedance network; and a second crystal rectifier having a cathode capacitor coupled to said base electrode and resistor coupled to said voltage divider, the resistor in said coupling being equal to the resistor in said resistor coupling of said first crystal rectifier anode and said control voltage input, and having an anode coupled to said fixed potential to compensate for tuning changes of said transistor amplifier by said first crystal rectifier and its capacitor coupling to said emitter whereby changes in control voltage changes the degenerative gain of the amplifier and said second crystal rectifier compensates for changes in tuning caused by changes in degenerative gain.

7. A compensated degenerative gain control for a transistor amplifier having a base electrode transformer coupled to an alternating current signal input, having a collector electrode transformer coupled to an output for the amplified alternating current signals, and having an emitter electrode impedance coupled to a fixed potential, the invention which comprises:

a control voltage input;

a voltage divider coupled between said control voltage input and said fixed potential;

a first crystal rectifier having an anode coupled through a first capacitor to said transistor amplifier emitter electrode and through a first resistor to said control voltage input and having a cathode coupled to said fixed potential to cause degenerative gain of said amplifier in correspondence with the applied control voltage; and a second crystal rectifier having a cathode coupled through a second capacitor to said transistor amplifier base electrode and through a second resistor to said voltage divider, said first and second resistors being of equal value, and having an anode coupled to said fixed potential to cause attenuation on said base electrode inversely to said degenerative gain whereby changes in control voltage will change the degenerative gain of the transistor amplifier by varying the bypass of the alternating current signals through the second crystal rectifier from the emitter impedance and will compensate for detuning of the amplifier in the second crystal rectifier caused by changes in degenerative control.

References Cited by the Examiner

UNITED STATES PATENTS 3,014,186 12/1961 Webster ---------- 330—29 X

ROY LAKE, *Primary Examiner.*

J. B. MULLINS, *Assistant Examiner.*